United States Patent
Fairbanks

(10) Patent No.: US 6,601,221 B1
(45) Date of Patent: *Jul. 29, 2003

(54) DESIGN VERIFICATION METHOD FOR PROGRAMMABLE LOGIC DESIGN

(75) Inventor: Brent Alan Fairbanks, Santa Clara, CA (US)

(73) Assignee: Altera Corporation, San Jose, CA (US)

(*) Notice: Subject to any disclaimer, the term of this patent is extended or adjusted under 35 U.S.C. 154(b) by 120 days.

This patent is subject to a terminal disclaimer.

(21) Appl. No.: 09/648,346

(22) Filed: Aug. 25, 2000

Related U.S. Application Data

(63) Continuation of application No. 08/227,293, filed on Apr. 13, 1994, now Pat. No. 6,182,020, which is a continuation of application No. 07/968,593, filed on Oct. 29, 1992, now abandoned.

(51) Int. Cl.[7] .............................................. G06F 16/50
(52) U.S. Cl. .............................. 716/5; 716/12; 702/117
(58) Field of Search ................................ 716/1, 2, 4, 5, 716/6, 11; 702/117; 324/76.11; 714/724, 725, 731; 703/13, 14, 15, 19

(56) References Cited

U.S. PATENT DOCUMENTS

| | | | | |
|---|---|---|---|---|
| 4,527,249 A | * | 7/1985 | Van Brunt .................... | 364/578 |
| 4,620,302 A | * | 10/1986 | Binoeder et al. .............. | 371/1 |
| 4,782,440 A | * | 11/1988 | Nomizu et al. ................ | 364/200 |
| 4,899,273 A | * | 2/1990 | Omodo et al. ................ | 364/200 |
| 4,922,432 A | * | 5/1990 | Kobayashi et al. ........... | 364/490 |
| 4,922,445 A | * | 5/1990 | Mizoue et al. ................ | 364/578 |
| 4,924,430 A | * | 5/1990 | Zasio ........................... | 364/578 |
| 5,019,961 A | * | 5/1991 | Addesso et al. ............... | 364/192 |
| 5,038,307 A | * | 8/1991 | Krishnamukar et al. ..... | 364/578 |
| 5,050,091 A | * | 9/1991 | Rubin ........................... | 364/488 |
| 5,062,054 A | * | 10/1991 | Kawakami et al. .......... | 364/491 |
| 5,097,422 A | * | 3/1992 | Corbin, II et al. ........... | 364/491 |
| 5,105,374 A | * | 4/1992 | Yoshida ....................... | 364/578 |
| 5,202,841 A | * | 4/1993 | Tani ............................. | 364/491 |
| 5,202,889 A | * | 4/1993 | Aharon et al. ................ | 371/27 |
| 5,220,512 A | * | 6/1993 | Watkins et al. .............. | 364/489 |
| 5,220,662 A | * | 6/1993 | Lipton ......................... | 364/575 |
| 5,243,538 A | * | 9/1993 | Okuzawa et al. ............ | 364/489 |
| 5,278,769 A | * | 1/1994 | Bair et al. .................... | 364/490 |
| 6,182,020 B1 | * | 1/2001 | Fairbanks .................... | 702/117 |

OTHER PUBLICATIONS

Takashima et al., "Programs for Verifying Circuit Connectivity of MOS/LSI Mask Artwork," 19th DAC, 1982, pp. 544–550.*

Chen et al., "Hierarchical Functional Verification for Cell–Based Design Styles," IEEE Proc., vol. 134, Part G, No. 2, 1987, pp. 103–109.*

(List continued on next page.)

*Primary Examiner*—Leigh M. Garbowski
(74) *Attorney, Agent, or Firm*—Townsend and Townsend and Crew LLP

(57) ABSTRACT

A technique for checking a logic design for compliance with a set of design rules in a computer-aided logic design system. An initial logic design is provided in computer-readable form in a logic design file. A set of design rules expressing permitted and prohibited structural and functional logic device relationships is provided as a portion of a logic design simulation system capable of synthesizing the initial design into a simulated network list. The initial design is checked against the various design rules incorporated into the set, and any violation of the design rules by the initial logic design is visibly displayed to the user. In one mode of operation, a list of user selectable optional rules is visibly displayed. A hierarchy of levels of design compliance is also displayed for user selection. For some design rules, a comparison can be made with the synthesized version of the initial logic design in order to spot design rule violations introduced by the synthesis process.

48 Claims, 5 Drawing Sheets

OTHER PUBLICATIONS

Agrawal, "Synchronous Path Analysis in MOS Circuit Simulator," $19^{th}$ DAC, 1982, pp. 629–635.*

Varma, "TDRC—A Symbolic Simulation Based Design for Testability Rules CHecker," 1990 Int'l Test Conference Paper 46.1, pp. 1055–1064.*

Spickelmier et al., "Critic: A Knowledge–Based Program for Critiquing Circuit Designs," 1988 IEEE Int'l Conf. on Computer Design, pp. 324–327.*

Beachler, "Design Tools for "Max"–imizing TTL Integration," Wescon 1988, pp. 1–5.*

* cited by examiner

DESIGN VERIFICATION METHOD FOR PROGRAMMABLE LOGIC DESIGN

This application is a continuation of U.S. patent application Ser. No. 08/227,293, filed Apr. 13, 1994, now U.S. Pat. No. 6,182,020 issued Jan. 31, 2001, which is a continuation of U.S. patent application Ser. No. 07/968,593, filed Oct. 29, 1992, now abandoned, which are incorporated by reference.

A portion of the disclosure of this patent document contains material which is subject to copyright protection. The copyright owner has no objection to the facsimile reproduction by anyone of the patent document or the patent disclosure as it appears in the Patent and Trademark Office files or records, but otherwise reserves all copyrights whatsoever.

BACKGROUND OF THE INVENTION

The present invention relates generally to tools for computer-aided software engineering. More specifically, the present invention relates to a software-implemented tool for assisting in the design of logic circuits having interconnected circuit elements, the invention providing a technique for checking a user's design against a set of design rules.

Computer design tools are known for assisting circuit designers in the laying out and simulation testing of logic circuitry. One such software base system is that system sold under the trademark MAX-PLUS available from Altera Corporation of San Jose, Calif. Typically, the designer uses such a system to initially design and subsequently test the operation of the design using computer simulation techniques. With reference to FIG. 1, a typical computer logic simulation technique proceeds by initially providing a logic design in the form of a schematic or netlist stored in a file 10 and converting the netlist by means of a logic compiler 12 into a simulator logic netlist 14 that is used by a logic simulator 15. In use, a set of simulation input vectors 16 is also provided to the logic simulator, which reads the simulator logic netlist, along with the simulator input vectors and "simulates" the operation of the logic design by propagating logic levels through the logic primitives in order to generate a set of output vectors 18, which are the simulated outputs of the logic design. This process has been found to be exceedingly useful in the field of logic design, particularly for complex circuits intended for physical implementation in erasable programmable logic devices (EPLDs) and mask programmable logic devices (MPLDs). Recently, with volume applications of circuits, the trend has been to either initially design the logic circuitry with MPLD implementation in mind, or to convert an original design intended for implementation in EPLD form to a functionally identical design intended for implementation in an MPLD form. Typically, a given user's design must conform to a set of design rules governing permitted and prohibited structural and functional configurations, in order for the design to be useful and reliable. Failure to comply with one or a few of the design rules, while not necessarily fatal to the operation of a circuit, can introduce operational uncertainties under special conditions, sometimes with a cumulative effect leading to a partially inoperative or, in extreme cases, a totally inoperative circuit design. While the logic simulation process is intended to reveal erroneous or inconsistent responses to stimulation by the test input vectors, such a result is only obtained after an often lengthy and time consuming simulation of the original design.

SUMMARY OF THE INVENTION

The invention provides a technique for checking a user's initial design against a predetermined set of design rules in order to uncover potential problems with an original design, which could result in an unreliable circuit, whether implemented in EPLD or MPLD form.

In its broadest aspect, the invention comprises a method for verifying an initial logic design in a computer-aided logic design system for designing and testing logic circuitry prior to physical implementation. The method includes the steps of providing a set of design rules expressing permitted and prohibited structural and functional logic device relationships, providing a logic design file incorporating the initial logic design in computer-readable form, comparing at least portions of the initial logic design with at least some of the design rules in the set, and providing a user-discernible indication of any violation of the design rules by the initial logic design. The method includes the step of enabling a user to select the level of design rule compliance from among a hierarchy of such levels. In addition, the method includes the step of providing a user-selectable list of optional rule selections. Thus, all rules in the set or only selected ones of the rules in the set are used to check the initial logic design for design rule compliance, with the level of compliance also being selectable by the user.

Both the hierarchy of levels of design rule compliance and the user-selectable list of optional rule selections are preferably visibly displayed to the user to aid in the selection of choices.

The method also provides for an additional comparison of at least some of the design rules with a synthesized version of the initial logic design in those cases in which the initial design undergoes logic synthesis. This capability is provided in order to check for design rule violations potentially introduced by the process of logic synthesis.

The invention provides a convenient and effective technique for verifying the compliance of an initial logic design against the set of design rules applicable to the type of programmable device in which the design will be implemented. Thus, the invention can be used in conjunction with ELPD and MLPD implementations. In addition, the invention can be readily expanded to include changes to an existing set of design rules or to implement new design rules found necessary or desirable in the computer-aided logic design process.

For a fuller understanding of the nature and advantages of the invention, reference should be had to the ensuing detailed description, taken in conjunction with the accompanying drawings.

DESCRIPTION OF THE PREFERRED EMBODIMENT

Figure 1:
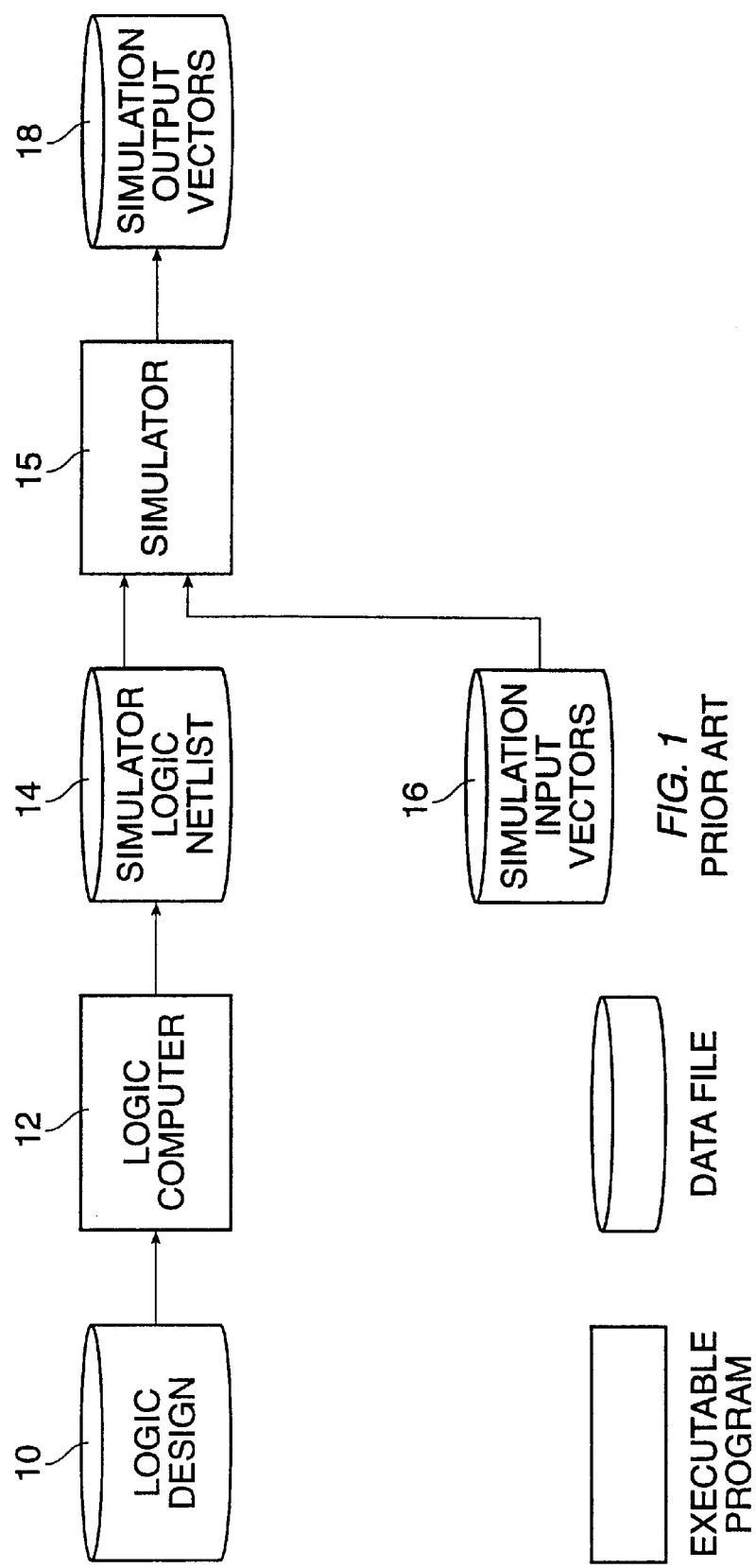
FIG. 1 is a schematic diagram illustrating a prior art computer logic simulation system.
Figure 2:
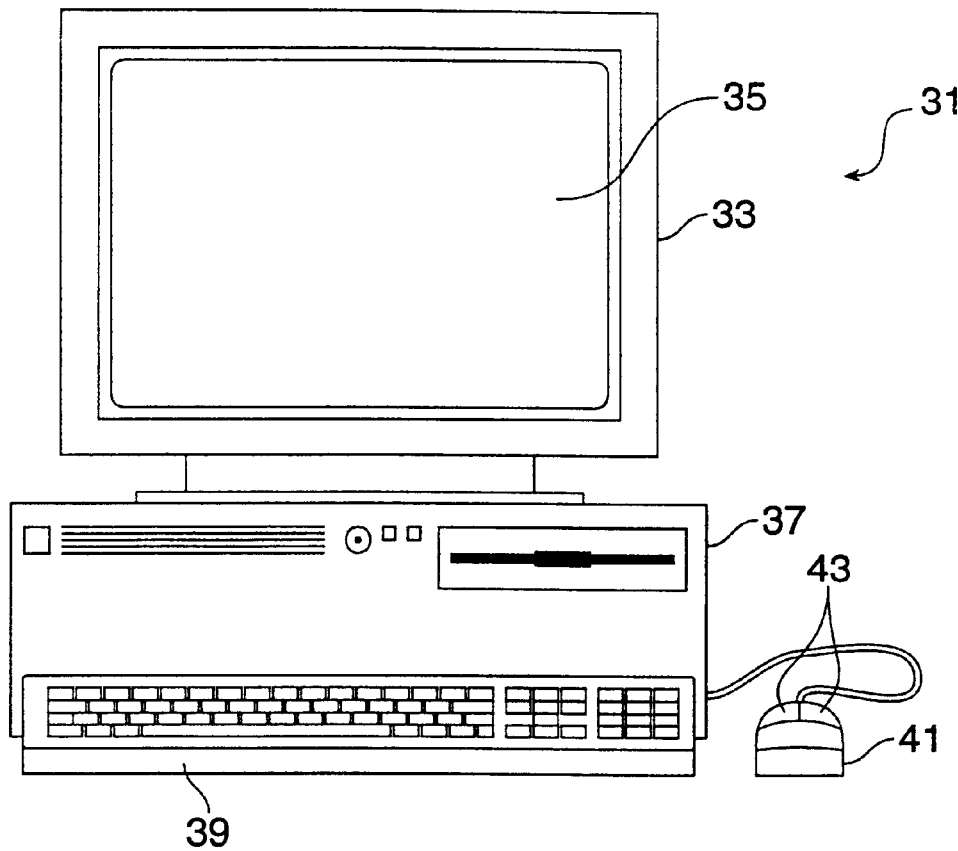
FIG. 2 is an illustration of computer hardware suitable for implementing the present invention.

FIG. 2 is an illustration of computer hardware suitable for implementing the present invention. As seen in this Fig., a computer system 31 includes a monitor 33, a display screen 35, a housing 37, a keyboard 39 and a mouse 41. Mouse 41 may have one or more mouse buttons, such as buttons 43. Housing 37 encloses typical computer components, such as a processor, memory, disk drives, and peripheral interface adapter (not shown). FIG. 2 is a representation of only one of many types of computer systems which are suitable for embodying the present invention. Other types of computer systems suitable for use in the present invention include so-called "notebook," "palmtop" or "hand-held," "pentop," etc., computers. Further, the use of the term "mouse" or "user input device" is understood to include other means for inputting information into a computer, such as touch screen, trackball, MIDI keyboard, light pen, data glove, etc. As will be readily apparent to one of ordinary skill in the art, many types of computer hardware, and configurations of the hardware, are suitable for use in conjunction with the present invention.

Figure 3:
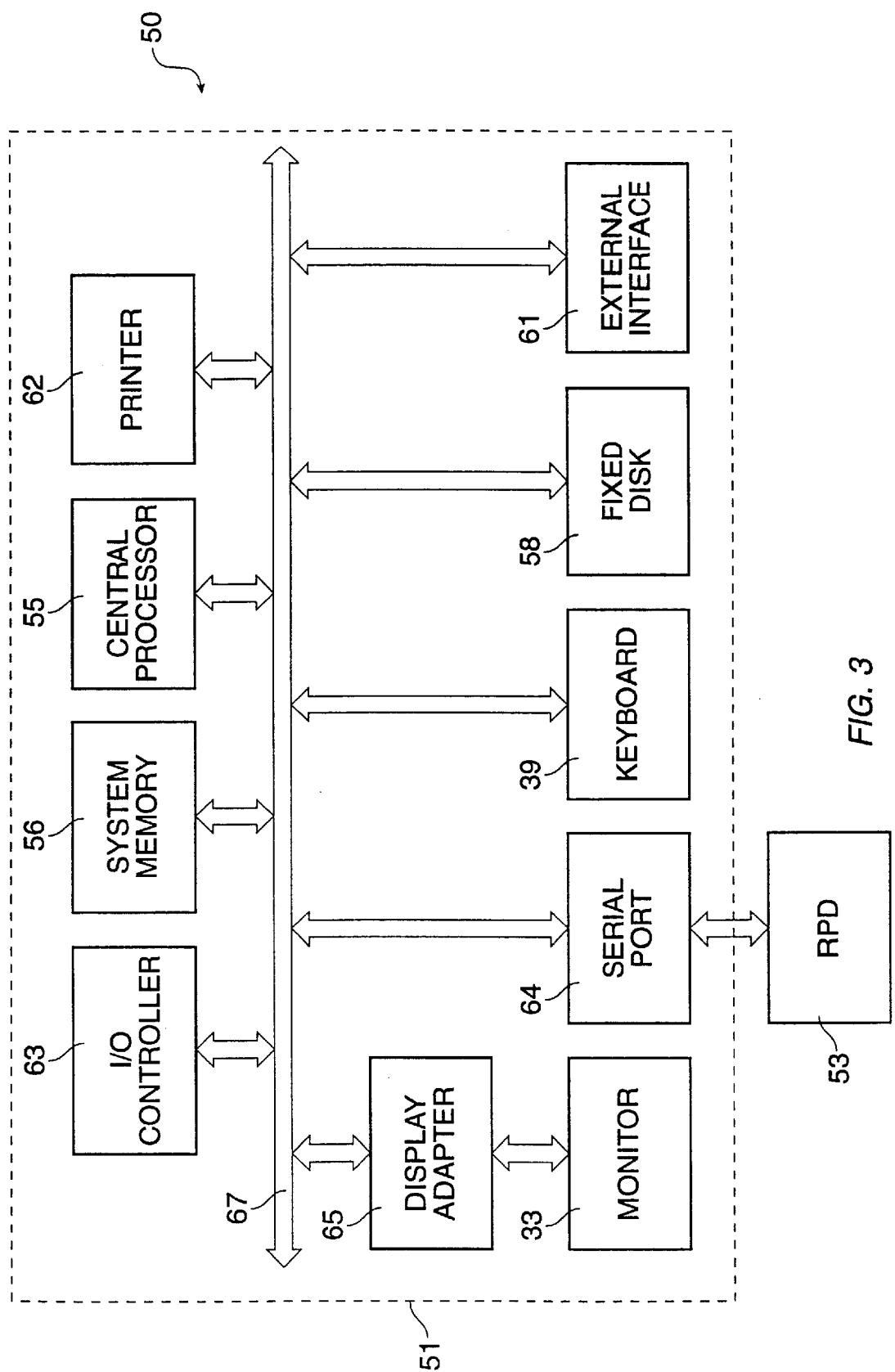
FIG. 3 is a block diagram of a system for implementing the present invention using the computer hardware shown in FIG. 2.

FIG. 3 illustrates a system 50 for implementing the invention using the computer hardware shown in FIG. 2. As seen in this Fig., system 50 includes a computer system 51 coupled to a relative pointing device (RPD) 53, for example a trackball or a mouse. The computer system 50 includes a central processor 55, a system memory 56, an input device, such as keyboard 39, a fixed disk 58, monitor 33, an external interface 61, a printer 62, an input/output (I/O) controller 63, a communications port 64, and a display adapter 65. A system bus 67 connects the components of computer system 50, providing a link among them. The keyboard 57 and RPD 53, taken individually or jointly, are data entry devices with which a user of the computer system 51 can interact with the design checking system.

A preferred embodiment uses an appropriately programmed IBM-compatible personal computer (PC) operating under the MS-DOS operating system using Windows 3.x as a shell. It is understood that other platforms are available and may embody the invention in other forms. The invention is not limited to embodiments that include PC-type computers, but may include other platforms, such as Apple Macintosh® computers (Apple Computer, Cupertino, Calif.) or Sun SparcStations, for example. The design checking invention is implemented by the central processor 55 under appropriate process control and instruction from procedures stored in the system memory 56 and provided as part of the system 50.

In operation, after a user has created the original design and reduced it to a suitable form for the logic design file (such as a network list), this design is checked against a preselected set of design rules.

Thus, the invention checks user designs for flaws that can cause reliability problems when the circuitry is implemented in silicon. This tool applies a set of rules, as specified below, to scan for various structures in the user's design that have been determined to cause problems. When a particular structure is located, the user is alerted and may then locate the structure in the design files. The invention can execute as part of the MAX+plus II compiler, and is controlled through an options dialog box. Different pre-defined sets of design rules are selectable, along with a user-specified rule set.

The primary motivation for the following rules is a functional MPLD implementation of a user's design. However, when a design satisfies the rules motivated by the MPLD conversion, it can be assumed that an EPLD implementation will be reliable as well. Thus, the invention is useful for checking both EPLD implementable designs and MPLD implementable designs.

User Interface

The invention appears as a user-selectable compiler option. Particularly, when selected from the menu, an icon resembling a doctor is displayed below the logic synthesis module. During compilation, the invention runs in three places: after netlist extraction, after logic synthesis, and after simulated netlist (SNF) extraction. At each point, a different subset of rules is executed. For example, illegal clock structures are detected after netlist extraction, while static hazards are detected in both the pre- and post-synthesis netlists after logic synthesis has executed.

Figure 4:
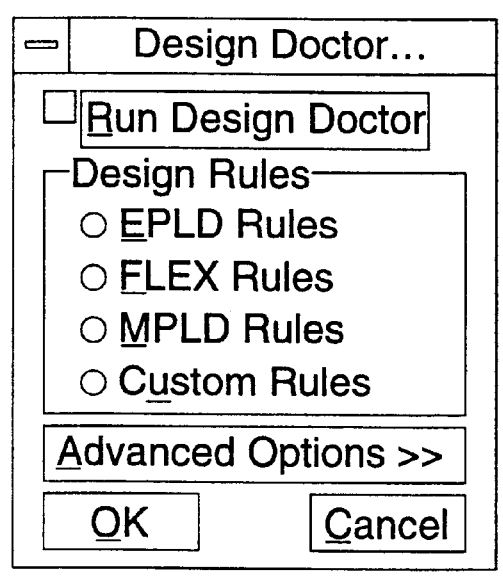
FIG. 4 illustrates a first-user interface in the preferred embodiment of the invention.

The invention is controlled through an Options menu item. This item opens a dialog box shown in FIG. 4 that controls the types of design rules to be applied and allows customization of the rule set.

Figure 5:
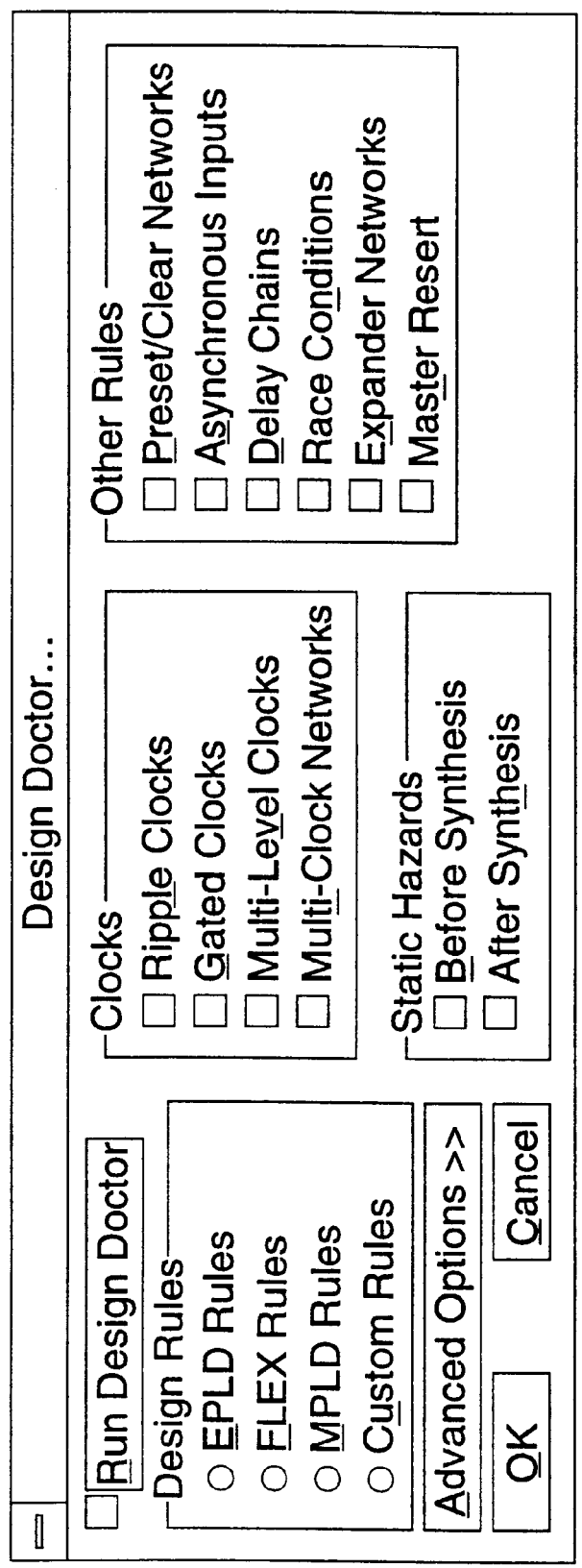
FIG. 5 illustrates a second-user interface in the preferred embodiment of the invention.
Figure 6:
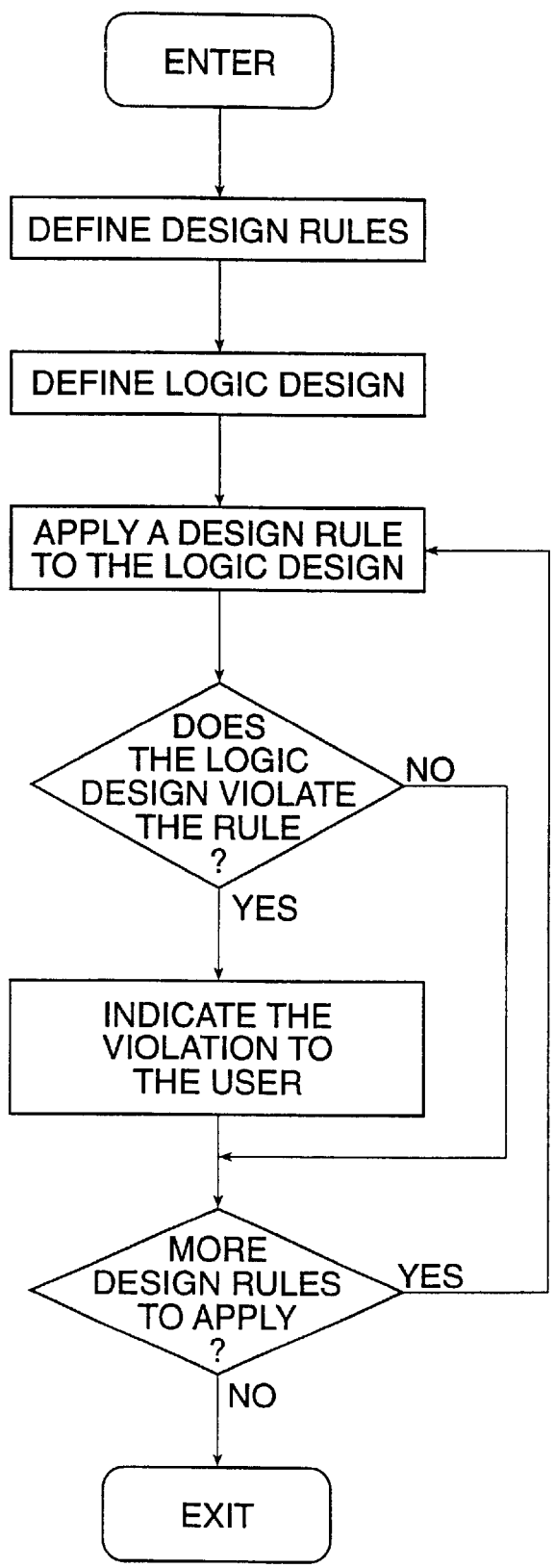
FIG. 6 shows a flow diagram of a system for designing and testing logic circuitry.

When the invention is set by the user to the "MPLD Rules" level (see FIG. 4), all rules will be executed, as described below. This level is the most time-consuming, and may generate a number of spurious warnings. A check at this level is required of any design submitted for MPLD conversion. To reduce the number of warnings, and speed the processing of a design, three other options are provided. The "FLEX" and "EPLD" levels prevent various rules from executing, or restrict the structures that a rule will warn about. Finally, there is a fully customizable warning set, which is controlled by a dialog box available by selecting the Advanced Options button. (See FIG. 5).

With the Advanced Options dialog box, the user can selectively enable or disable every rule that the invention executes. The setting of each of the rules in the custom configuration, and the current rules level, is saved in the project initialization file. The default for a new project is the "FLEX" warning level, with the rules that make up this level selected in the Advanced Options dialog box.

Design Rules

The invention checks the following set of design rules. Each of these rules is controlled with a check box in the customize dialog box (see FIG. 5). Every rule is applied when aggressive ("MPLD") checking is selected, and various rules are applied when lower or custom levels are used, as noted below. When a design rule violation is detected, a warning is issued to the user via the display. In the preferred embodiment, each warning is of the form: "Design Doctor Warning:" followed by a description of the violation. If desired, the user can call up for display those portions of the original design logic circuitry pertinent to the warning.

Clocking Schemes

The most important system in a synchronous design is the clocking of registers. The preferred clock design for a MPLD implementation is global clocking, in which a single pin serves as a clock source for all registers in a design. This approach, as well as clocks driven by a single pin, will be approved by the invention. All other approaches will generate a warning.

These rules are executed at all warning levels, before logic synthesis.

Ripple Clocks

A ripple clock exists when the output of one register feeds the clock of another register. This is not really dangerous in itself, but will produce a warning at all levels. However, if the output of one or more flipflops in a chain feeds into combinatorial logic (for example, a decoder), a warning will be issued that there may be glitchiness.

Gated Clocks

If a flipflop's clock is fed by combinatorial logic, then there must be at most two gates between the clock and any input pins feeding the clock. In any path, there must be only AND, OR, NAND, NOR, and NOT gates. Also, there should only be two AND/OR (NAND/NOR) gates in total. Any variation from this pattern will produce a warning. Also, if two or more registers feed a clock through logic, then a warning will be issued, since it cannot be guaranteed that the registers will change at the same time, and that the delay paths to the clock will be the same length.

Multi-level Clocks

Any other clocking schemes will fall under the general heading of multi-level clocks. When such a clocking scheme is detected, an advisory warning is issued to the user, in the nature of a directive to consult detailed reference sources, such as the design rule set described in Appendix A, for more information.

Multi-Clock Networks

This rule checks to determine whether a synchronous device that is synchronized to one clock receives data that is synchronized to another clock. Unless the device is a synchronizing register having a single input from the other clock group, a warning is issued that this is a design violation.

Preset and Clear Configurations

The rules listed in the previous section are also applied to the preset and clear signals of a flipflop. These signals ideally should be driven by input pins, but barring that, should be driven by no more than two levels of logic. Any combination of multiple flipflops, or flipflops with input pins, will generate a warning.

Static and Dynamic Hazards

A static hazard occurs when an input changes logic levels and causes an output to momentarily change levels, or glitch. This occurs because the new set of input vectors maps to a different cover on the function's Karnaugh map than the original set. If both sets of input vectors map into the same cover on the Karnaugh map, then a static hazard does not exist. A dynamic hazard occurs when an output should change state, but actually changes three times, instead of just once. This implies at least three paths through the function of interest.

There are two possible sources of hazards in a design compiled for an EPLD. In the first case, the user's design may contain various hazards. In the other, logic synthesis may introduce hazards into the design. To check both possible sources of hazards, the invention runs this rule both before and after the Logic Synthesis module. If the user is only looking for faults in their original design, this rule will run before logic synthesis. If the user is looking for faults in both cases, this rule will run after logic synthesis, where it can look at both the pre-synthesis design and the post-synthesis design. If the user is only looking for faults from synthesis, both designs will be analyzed after Logic Synthesis has executed, and faults from the original design will not be reported.

Since hazards do not really matter if they only affect the data input of a flipflop, the invention does not check such logic. It does check logic that feeds all control pins of a flipflop, as well as any purely combinatorial networks. This rule will execute at the "FLEX" and "MLPD" level for the post-synthesis network, and at all levels for the pro-synthesis network.

Latching Asynchronous Inputs

To avoid setup and hold problems with asynchronous inputs, the rule checks all input pins and to see whether or not they are latched with the clock of any synchronous devices that they feed. The theory here is that an asynchronous input should fan out to at most one synchronous device, which would be considered the synchronizing latch. An input that feeds a purely combinatorial network will not be subject to this rule, unless the network feeds into the data line of a flipflop.

Race Conditions

The invention searches for certain types of critical races when this rule is selected. It will not have the capability to search for the conventional two-or-more-inputs-switching-at-once type of race, since the number of two-or-more input networks in a large design is vast. The invention does detect the use of a flipflop depending on its output for some other control logic. A good example of this is a pulse generator in which a signal clocks VCC into a DFF, and Q feeds the CLRN through a NOT gate. This configuration would create a pulse of uncertain width. Therefore, this rule looks for flipflops that depend on their output for one of their control signals, namely CLK, CLRN, PRN, or ENA.

Delay Chains and Asynchronous Pulse Generators

This rule checks the original design for chains of primitives available to the user, such as expanders, MCELLs, or SOFTs in the Altera System. It looks for cases in which one of the given primitives has a single fan out to another of the primitives, with some added look-ahead. For example, b=mcell(mcell(a)) will be found, while b=soft(exp(a)) will not. The look-ahead is used to check for structures of the form b=mcell(exp(mcell(exp(a)))). These structures generate a warning at all levels, since they indicate a reliance on a fixed delay, and this cannot be guaranteed across device speed gates, fabrication differences, temperature, etc.

Cross-coupled Expanders

Basically structures to be avoided, cross-coupled expanders will always cause a warning to be generated when found. The type of warning will be determined by reading the user's design, and looking for an EXPDFF, EXPLATCH, NORLATCH, or NANDLATCH primitive. If one of these macrofunctions is found, then a mild warning will be issued at the "FLEX" and "MPLD" levels. If user-created cross-coupled expanders are found, a harsh warning will be issued at all levels.

Use of a Master Reset

When converting a design from an EPLD to an MPLD, state machines and other registered logic lose the assumption of power-on reset. Therefore, a design to be converted must have a master reset pin that clears all flipflops, which would be driven by some board-level signal. The rule attempts to isolate a common reset pin from all registers, even if there is combinatorial logic on some of the lines (for example, active low LLCLR=/reset & . . . ).

This rule will only be active at the "MPLD" level, since it is only useful for checking a conversion to an MPLD. It will execute either from the user's original design, or from the SNF.

Stuck States

A design may include a set of flipflops that effectively function as a state machine, which can include stuck states.

The invention will try to isolate groups of flipflops that act as state machines, even though they are not explicitly declared as a state machine. If it finds such groups, it analyzes the state transitions of the machine, and looks for mutually exclusive groups of states. In other words, a state machine should not have states that cannot return to the base state. (For example, A→B→C→A, and D→E→F→D indicates that one of the two groups is stuck.) Since this could be very time consuming, it is only executed at the "MPLD" level.

Different Output Delays Within a Group

When the invention finds an output group, this rule checks the clock to output delays of each member of the group. If the delays are not identical, this indicates possible glitches off chip. This rule, working from the SNF, is activated at both the "FLEX" and "MPLD" levels.

Detailed Discussion

The following is a detailed discussion of the algorithms used to check a user's design. Each of the various algorithms is first discussed and then listed. If an algorithm depends on the output or data structures of another algorithm, it will be noted in the discussion. Following the description of the algorithms is a discussion of the data structures that are used in the invention. A brief description of each data structure follows each definition. Finally, the entry point from the Compiler is described. This serves as the final authority on when a particular design rule will be executed.

Clock Analysis

These routines attempt to isolate clock structures, and report to the user when a structure that violates the currently selected design rules is found. The analysis of clock structures consists of two parts. First, the routine drc_mark_clock_groups( ) isolates groups of synchronous devices which share the same clock logic, whether it be an input pin, an equation, or another synchronous device. Then, with the clock groups isolated, the routine drc_reduce_ripple_clocks( ) combines clock groups that are part of a ripple clocking chain. These are of the form C.CLK=B.Q, B.CLK=A.Q., etc. Finally, the equations or pins that drive a clocking group are analyzed, and warnings will be issued based on the rules that are currently selected. The clocking groups are saved for use by drc_check_asynch_signals( ) (see below under the heading Asynchronous input pins).

The first stage of the clock analysis consists of collecting all synchronous devices into clock groups, which are identified by the compiler database ID of the pin, flipflop, or gate that feeds the devices. When the group ID for a device has been determined, the group will be found from the list of known groups. If the group does not exist, a new group is created and inserted into the list of groups. Then, the device ID is added to a linked list of all synchronous devices in the group, which will be used for checking asynchronous signals and for error reporting.

```
drc_mark_clock_groups()
{
    for all synchronous devices D in netlist N
    {
        if (D.clk directly connected to a pin)
        {
            GROUP(D) = pin_id;
        }
        else
        {
            if (D.clk directly connected to a DFF.Q or JKFF.Q)
            {
                GROUP(D) = device_id of synchronous device;
            }
            else
            {
                This clock is a combinatorial function of pins
                and/or flipflops.
                GROUP(D) = database ID of the gate that feeds the
                clock
            }
        }
        if (negative connection) NEGATIVE(D) = TRUE;
        Create a new group if necessary
        Add D to the group
    }
}
```

The second and third stages of clock analysis involve reducing ripple-clocked groups, and analyzing the clocking groups determined by drc_mark_clock_groups( ). Since a ripple clocking group has each member driven by a different signal, namely the output of the previous member, each member will create its own clocking group. Also, because the records for the group could occur in any order in the database, the groups cannot be combined during the first pass. Therefore, the routine drc_reduce_ripple_clocks( ) scans the list of clock groups, and looks for ripple chains. It condenses these chains into a single clocking group, with the group ID from the first device in the chain.

Once all of the clock groups have been identified and reduced, the main analysis is started. This looks at the logic that drives each clock group, and compares it to known legal and illegal structures. The reporting of warnings will vary depending on the design rules selected by the user. For example, if the user selected the ripple clocking design rule, any ripple groups found in the design will be reported. However, regardless of whether this rule is selected, the ripple group will be checked to see if it feeds any logic, as would a ripple counter. This will always generate a warning.

After ripple clocking, the clock group is checked to see if it is driven by an input pin. If not, the logic that drives the group will fall into one of three categories. The first is a logical combination of register outputs and possibly input pins. For this case, there must be at least one register and one pin, since a single register would fall into a ripple group, or two or more registers with zero or more pins. In both cases, a warning will be issued about registered clock lines if the user has enabled gate clock checking.

The second case occurs when the clock is a logical function of input pins. Any single pin clock groups are used here, to determine if the equation involves another known clock line. A warning will be generated if the logic is more complicated than two gates in an AND-AND, OR-OR, or similar configuration. Also, if a known single pin clock is used in the equation, the other logic should look like an enable signal. If it does, the inventor will suggest that the user use an enabled DFF. Otherwise, a warning will be issued.

The final case involves multiple level logic and other structures that the invention cannot analyze. In such a case, a warning is be given that the clock logic is too complicated, and can not be analyzed.

```
drc_check_clocks()
{
    drc_mark_clock_groups();
    /* This function will scan the clock groups for ripple clocking */
    /* groups, and reduce them to a single ripple clocking group. */
    drc_reduce_ripple_clocks();
    for all clock groups
    {
        if (group.ripple_group)
        {
            if (drc_rules.check_ripple_clocks)
                warn the user that a ripple clock group was found
            /* Check for logic fed by the ripple clock group */
            drc_check_ripple_clocks();
        }
        /* Check the equation feeding the clocking group */
        if clock is not a pin
        {
            if clock is an equation involving other synchronous
            devices, and drc rules.check_gated_clocks, then warn the
            user that there is an unreliable registered clock
                else if the clock is an equation of input pins, then
            determine if the equation is "complicated" If so, and
            drc_rules.check_gated_clocks, then warn the user that
            there is an illegal gated clock network
                else if drc_rules.check_multi_level_clocks, warn the
            user that something too complicated to diagnose exists
        }
    }
}
```

Preset and Clear Configurations

The analysis that is performed for clocking schemes is repeated for preset and clear logic. The major difference is that a design should have a master reset pin if it is intended to be converted to an MPLD. Therefore, the Design Doctor will attempt to isolate a master reset pin when it builds the list of reset groups. If a master reset is actually located, then the tests of logic on the reset lines will be modified, to look for simple functions involving this master reset.

```
drc_check_preset_clear
{
    /* Establish reset groups, and try to find a master reset pin. */
    drc_check_master_reset(),
    for all reset groups that are not simply pins
    {
        if a master rest was found
        {
            if reset is not a simple combinatorial function
            involving the master reset
            {
                if reset and clear do not share common terms
                    (i.e. not an Asynchronous load)
                {
                    if reset is an equation involving other
                    synchronous devices, and
                    drc_rules.check_gated_clocks, then warn the
                    user that there is an unreliable registered
                    reset
                        else if the reset is an equation of input
                    pins, then warn the user that there is an
                    illegal gated reset network
                        else if
                    drc_rules.check_multi_level_clocks, warn the
                    user that something too complicated to diagnose
                    exists
                }
            }
        }
        else
```
```
        {
            /* Repeat code that looks for registers, gated nets */
        }
    }
    /* Check preset networks in a similar manner, */
    /* without looking for a master preset */
}
```

Static and Dynamic Hazards

"If, in response to an input change and for some combination of propagation delays, a network output may momentarily go to 0 when it should remain a constant 1, we say that the network has a static 1-hazard. Similarly, if the output may momentarily go to 1 when it should remain 0, we say that the network has a static-0 hazard. If, when the output is supposed to change form 0 to 1 (or 1 to 0), the output may change three or more times, we say that the network has a dynamic hazard." Charles H. Roth, Jr. Fundamentals of Logic Design, Second Edition, c. 1979 West Publishing Company.

The following routines isolate instances of static hazards. As noted above, the user interface allows a designer to search for hazards in the original design, to search for hazards introduced by logic synthesis, or to look for both. In order to handle this, the routine below is written to handle the compiler database both before and after logic synthesis. In fact, all of the necessary records exist after logic synthesis, allowing this routine to be called after that module has run.

The routine drc_check_hazards( ) is called once, regardless of what the user has requested for hazard detection. It then determines what parts of the compiler database to check, and how to deal with warnings. This routine prevents two warnings about the same bit of logic, since that can only happen if the user's original design contains hazards. In that case, the warning about the original design will be issued, with a note that the hazard exists after synthesis as well.

To handle this processing, drc_check_hazards( ) calls a second routine, drc_check_function_for_hazards( ), that performs the actual hazard testing. This function has the ability to work from both sets of compiler database records, and determines which set to analyze based on the validity of passed parameters. Once it has constructed the appropriate logic trees, the function calls drc_create_sum_of_products( ) to reduce each of the trees to sum of products form, and then passes the reduced trees to drc_check_trees( ), where they are checked for hazards and compared against each other.

After the sum of products equation has been dealt with, the original equation is inverted and reduced to produce an equation that lists the 0-terms of the function. This new equation is processed in the same manner as the original equation, resulting in a list of any static-0 hazards.

```
drc_check_function_for_hazards
(
    DST_ID      primitive_id,
    DBT_ID      resource_id
)
{
    if valid resource_id
    {
      if valid primitive_id
      {
          build logic trees F and G from both records
          copy each tree, and invert each copy to produce F' and G'
          reduce the trees F and G to sum-of-products forms
          reduce the copies F' and G' to sum-of-products forms
          drc_check_trees (F, G, 1);
          drc_check_trees (F', G', 0);
      }
      else
      {
          build logic tree G from the post-synthesis record
          copy the tree, and invert the copy to produce G'
          reduce the tree G and the copy G' to sum-of-products
          drc_check_trees(0, G, 1);
          drc_check_trees(0, G', 0);
      }
    }
    else
    {
        build logic tree F from the pre-synthesis record
        copy the tree, and invert the copy to produce F'
        reduce the tree F and the copy F' to sum-of-products
        drc_check_trees(F, 0, 1);
        drc_check_trees(F', 0, 0);
    }
}
drc_check_hazards(BOOL check_user_net, BOOL check_logsyn_net)
{
    /* Determine which network to check -- RDFs or discrete gates */
    if (check_logsyn_net)
    {
        if (check_user_net)
        {
            for all post-synthesis records (RDFs)
            {
                find the equivalent pre-synthesis record (prim)
                drm_check_function_for_hazards(prim, RDF);
            }
        }
        else
        {
            for all post-synthesis records
            {
                drc_check_function_for_hazards(0, RDF);
            }
        }
    }
    else
    {
        for all pre-synthesis, user networks
        {
            drc_check_function_for_hazards(prim, 0);
        }
    }
}
```

The function drc_check_trees( ) accepts one or two logic trees generated by drc_check_function_for_hazards( ), and analyzes them for static hazards. When the drc_check_trees( ) finds hazards, it compares the list of hazards from the pre-synthesis tree to the list of hazards from the post synthesis tree, as appropriate. It then determines what error messages to display, based on whether the user has selected pre or post synthesis hazard detection, or both. The procedure for checking a function for hazards, as shown below, works from a sum of products equation generated from the database. The equation, of he form $F=\bar{a}b+\bar{a}c+b\bar{c}d+abc$, will be analyzed in pairs of terms, in order to isolate adjacent covers. These will be found when two terms contain the same variable, but in complementary sense, for example $\bar{a}b$ and abc from F. Then, the routine collects all of the other variables contained in those two terms, and attempts to find a term that covers this collection. In the function F, there is no cover for the term bc, so static-1 hazard exists in the function. On the other hand, $\bar{a}c$ and $b\bar{c}d$ produce the set of variables $\bar{a}bd$, which is covered by the term $\bar{a}b$.

```
drc_check_trees
(
    DRCS_TREE_NODE          *pre_synth,
    DRCS_TREE_NODE          *post_synth,
    int                     hazard_type
)
{
    for each valid sum-of-products tree, with k terms
    {
        for i = 1 to k
            for j = i + 1 to k
                if F_i and F_j have complementary components
                {
                    find the set of common terms that are not complemented
                    for 1 = 1 to k,1 <> i and 1 <> j
                        if F_i covers the common set, then no hazard
                    if no F_i found,
                        then write a hazard warning to buffer
                }
``` cases of combinatorial feedback. Then, the function drc_create_sum_of_products( ) is called, which recursively reduces the tree into a sum-of-products form.

The actual reduction is handled by the function drc_compress_tree( ). This function performs the Boolean algebra functions AND and OR (or "multiply" and "add") from the deepest nesting level upwards. As it works its way up the tree (or, conceptually, from the most nested parenthesis), it produces trees that are at most a single level deep. In other words, the tree produced by this function will always be of the sum-of-products form term+term+ . . . , where term is a single literal, or a product of literals (e.g. A, AB, ABC, etc.). When the function returns a tree to drc_create_sum_of_products, the result is by definition a sum-of-products expression. The function also removes trees that reduce to VCC or GND during multiplication, as well as duplicated terms and trees that are absorbed by other trees (e.g. AB absorbing ABC).

```
drc_create_sum_of_products(DRCS_TREE_NODE **node)
}
        expand all exclusive-or (XOR) operators in the tree
        convert all NAND and NOR operators using DeMorgan's inversion on
            the terms and subtrees feeding a node
        convert all stacked gates, e.g. AND(AND(...)) to single gates
        new_node = drc_compress_tree(node);
        return (new_node);
}
drc_compress_tree(DRCS_TREE_NODE *node)
{
        for all subtrees of node
            list[index] = drc_compress_tree(subtree)
        /* For an AND, perform multiplication, */
        /* i.e. (A+BC) (D+EF) = ABD + AEF + BCD + BCEF */
        if node is an AND operation
        {
            new_node = list[0];
            for all entries in list except list[0]
                new_node = drc_multiply_trees(new_node, list[index]);
        }
        /* For an OR, perform addition */
        /* i.e. (A + B + CD) + (E + FG) = A + B + E + CD + FG */
        else
        {
            for all entries in list
                if list[index] is an OR operation,
                    absorb its terms into new node's terms
                else
                    add it to new node's subtree list
        }
        return (new_node);
}
```

-continued

```
    }
    if both trees are valid
    {
        compare the error buffers and report each distinct
            error, as well as all duplicated errors.
    }
    else report all errors to the user
}
```

Finally, the procedure to generate sum-of-products trees is as follows. First, a tree is built from the compiler database by directly reading in the description of logical gates, and converting these to DRCS_TREE_NODE structures. All registers and input pins are treated as sources, as are any

Asynchronous Input Pins

To reduce the possibility of setup and hold violations, a design should latch any input signal to the clock of the synchronous network that the signal feeds. This routine determines if an input signal drives more than one flipflop by tracing the data lines of every synchronous device back through logic to either other synchronous devices or input pins. Each device that depends directly on an input pin will therefore increase that pin's usage count by one. At the end of tracing, the routine merely reads these usage counts, which determines the fanout of the pin.

Also, a signal which is generated by a register synchronized to one clock should be latched to the clock of any other register that the signal feeds. Therefore, when a trace terminates at a synchronous device, the clocking group ID of the terminal device is checked against the clocking group ID of the original data port. If the IDs do not agree, then a device that is synchronized to one clock is receiving data synchronized to another clock. That configuration is a design violation unless the register is a synchronizing register, which has a single input from the other clock group (e.g. reg_b is a synchronizing register if reg_b.d=reg_a.q, reg_a.clk=clk_a, reg_b.clk=clk_b)

This function is always executed, since it determines whether any multi-clock systems exist, and where there are any problems with those systems.

```
drc_check_asynch_signals()
{
    for all clocking groups G
    {
        for all synchronous devices D in group G
        {
            for all data/enable ports
            {
                trace logic backwards
                if a path terminates on a pin
                {
                    increment pin->usage_count;
                    add this destination to pin->destinations
                }
                else
                {
                    if device E is in another clock group
                    {
                        if D is not a function of E only,
                        then issue a warning
                    }
                }
            }
        }
        if (dcr_rules_check_asynch_inputs)
        {
            for all input pins I in netlist N
            {
                if I->usual count > 1
                generate error with all locations
                reset I->usage_count
            }
        }
    }
}
```

Race Conditions

The invention will find critical races that involve control signals that depend on the register that they control. It will not search for other critical races, which involve two (or more) inputs to a function switching at the same time. This routine performs a simple trace of the logic driving each of a register's control lines, stopping at pins and other registers. A warning is issued if the register's output is found in any of the equations.

```
drc_check_race()
{
    for all synchronous devices D in netlist N
    {
        trace the equation for each control signal (CLK, CLR, PRE),
            stopping at other synchronous devices
        if D.Q exists as a term in any equation, then warn that a
            race has been found
    }
}
```

Delay Chains and Asynchronous Pulse Generators

The use of chains of expanders or MCELL primitives to modify the timing of a device will be detected by this function. Since the database records of members of a chain can come in any order, this function makes a total of three passes through the compiler database. On the first pass, it locates all primitives which appear to be part of a delay chain. Then, if it found delay chains, a second pass reduces the number of marked primitives to one per chain, in order to facilitate error reporting. Finally, a third pass reports all the errors, after verifying that a chain has been found, and not a configuration of the type represented by MCELL(NOT ( . . . )), with the polarity of the output versus the input reported as well.

```
drc_check_delay_chains()
{
    /* Find all potential chains */
    for all devices D in netlist N
    {
        if D is an expander, not gate, SOFT, or MCELL
        {
            if D has a single input, driven by a expander, not
                gate, SOFT or MCELL
            {
                D->chain = TRUE;
                chains_detected = TRUE;
            }
        }
    }
    /* Reduce all chains to a single flag on the chain's output */
    if (chains_detected)
    {
        for all devices D in netlist N
        {
            if (D->chain)
            {
                D' = D->source;
                whiie (D'->chain)
                {
                    D'->chain = FALSE;
                    D' = D'->source;
                }
            }
        }
        /* Report the error at the chain's output */
        for all devices D in netlist N
        {
            if (D->chain)
            {
                check the composition of the chain, and check
                    the sense of the signal by tracing back
                    to the start of the chain
                if it is a true chain, report the error, with
                    the calculated sense
            }
        }
    }
}
```

Cross-Coupled Expanders

This function detects expander latches and other cross-coupled expander structures. It uses some graph-theory algorithms to isolate all loops in a graph which represents the network. This is done by building a directed graph with all the connectivity of the network. Then, starting at registers and pins, forward and backwards dependencies are removed. When a node no longer has any forward dependencies, all nodes on which it has backwards dependencies on can remove this node from their forward dependency lists, and the mode can be deleted. This deletion is performed recursively through the graph. Backward dependencies are handled in the same manner. At the end of this algorithm, the only nodes with dependencies are those that are part of a combinatorial loop, or are dependent on a combinatorial loop.

With this information, the graph is then searched for small loops that look like latch structures. These typically involve four gates in the database, consisting of two AND or NAND gates and two place holder EXPANDER or MCELL gates. When one of these is found, the nearby area is checked for two more latches. This indicates the presence of a known class of DFF built from logic, where two latches perform the preset and clear operations, and feed a third output latch.

When a LATCH or DFF structure is isolated, the invention looks at the full name of the gates for the keywords EXPLATCH, EXPDFF, NANDLTCH, and NORLTCH. These indicate that they may be ALTERA-supplied macrofunctions, and cause a different type of warning to be issued. The user is then warned about the structure, whether it meets the LATCH or DFF criteria or whether it is an unknown structure.

```
drc_check_expanders( )
{
    for all devices in the network, generate input and output lists
    for all devices in the network
        if the device is an output or a register, remove it
            as an output from all input dependents
        if a dependent's output list is now empty, recurse backwards
            doing removals until an output list doesn't disappear
    for all devices in the network
        if the device is an input or a register, remove it
            as an input from all output dependents
        if a dependent's input list is now empty, recurse forwards
            doing removals until an input list doesn't disappear
    for all devices in the network
        if input or output list not empty, then a loop exists
            find the "end" of the loop by scanning to outputs
            drc_analyze_loop(device_id);
}
drc_analyze_loop(device_id)
{
    /* Look for a four-gate cross-coupled structure */
    if the immediate area looks like a latch
    {
        /* Look for a twelve-gate cross-coupled structure */
        if a bigger area looks like a dff
        {
            warn about combinatorial dff
            set input and output lists for the latch to empty
        }
        else
        {
            warn about combinatorial latch
            set input and output lists for the latch to empty
        }
    }
    else
    {
        warn about unknown structure
        set input and output lists for the structure to empty
    }
    clean up "bridges" around this area
}
```

Use of a Master Reset

This function attempts to isolate an input pin that serves as a master reset signal to the user's design. It will also determine the reset groups in a design, which are groups of synchronous devices that are reset or preset by the same signal. These groups, as well as the master reset (if found), are used by drc_check_preset_clear( ) to check all reset configurations in a design.

Finding a master reset contains this heuristic: the master reset should be in the reset equation of most registers. When searching for the master reset, single pins are weighted more heavily than groups of pins. If a reset group consisting of a single pin is found, then the number of registers in this group is added to the pin's usage count. If there are several pins involved in some logical equation, then the usage count for each pin in the group will be increased by one, instead of by the number of registers in the group. After all the reset groups have been analyzed, a master reset is identified from the counts generated during the scanning.

```
drc_check_master_reset( )
{
    drc_mark_reset_groups( ),
    add all input pins in the network to a list of unknown pins
    for all reset groups
    {
        if the group is a single pin
        {
            if the pin is a perspective master reset
            {
                add the number of devices in the group to the
                pin's usage count
            }
            else
            {
                add the pin to prospective master resets
                set usage count to unknown usage + number of
                    devices in group
                remove the pin from the list of unknown pins
            }
        }
        else add one to each pin's usage count
    }
    if there is exactly one prospective master reset,
        then it has been found
    else
    {
        if there are more than one prospective master resets
        {
            if one has usage counts greater than twice the nearest
                competitor, and usage count greater than an average
                usage call it the master reset (otherwise there
                may be multiple, disjoint reset groups)
        }
        else /* No prospective master reset */
        {
            if one of the unknown pins has a usage count that
                meets the conditions above when compared to the
                other unknown pins, call it the master reset
        }
        if (drc_rules.check_master_reset)
        {
            if no master reset found
                warn that a master reset was not found
            else if a master reset was heuristically determined,
                warn that the pin was assumed to be the master
                reset
        }
    }
}
```

The following functions may also be included in the preferred embodiment of the invention. The first will check the efficiency of each macrofunction in the user's design against a precompiled list of macrofunctions and equivalents. The second will verify that the time to outputs for each member of a known group are identical. The last will attempt to isolate any unknown state machines, and check to see if they contain possible stuck states.

```
drc_check_macrofunctions( )
{
    read in the device family for this compilation
    read in the database of macrofunctions
```

```
    for all nodes in the hierarchy tree
    {
        look up the record for this macrofunction
        see if there are more efficient macrofunctions listed for
            this entry
        if so, inform the user of the better possible choice
    }
}
drc_check_output_groups( )
{
    for all groups in the netlist
    {
        check the time to outputs for each member of the group
        if the times differ, warn the user
    }
}
drc_check_state_machines( )
{
    determine all nets of dependence for synchronous devices
    determine where subnets can be isolated
    for all isolated subnets
    {
        determine a state transition diagram based on the logic that
            connects the net
        look for disjoint cycles in the diagram
        if any are found, then there are stuck states
    }
}
```

Data Structures
DRCS_DESIGN_RULES

```
typedef struct
{
    BOOL check_ripple_clocks;
    BOOL check_gated_clocks;
    BOOL check_multi_level_clocks;
    BOOL check_preset_and_clear;
    BOOL check_user_hazards;
    BOOL check_logsyn_hazards;
    BOOL check_asynch_inputs;
    BOOL check_race;
    BOOL check_delay_chains;
    BOOL check_expanders;
    BOOL check_master_reset;
    BOOL check_macrofunctions;
    BOOL check_output_groups;
} DRCS_DESIGN_RULES;
```

This structure contains a flag for every design rule within the preferred embodiment of the invention. This structure is used to control design rule checking, and to set up the Advanced Options dialog box. As new design rules are developed, flags will be added to this structure. Each element of this structure is also written out to the project initialization file in the form RULE_NAME=0/1.
DRCE_SELECTED_RULE

```
emun
{
    DRC_NO_RULES = 0
    DRC_EPLD_RULES,
    DRC_MPLD_RULES,
    DRC_CUSTOM_RULES,
    DRC_FLEX_RULES,
    DRC_MAX_RULES
} DRCE_SELECTED_RULE;
```

This type encodes the current selected rule set. The EPLD, Flex and MPLD rule sets map to a particular pattern of TRUE flags in the design rules structure above, while the custom rule set allows an arbitrary pattern. This is used to set up the Advanced options . . . dialog box, and as a shorthand for the three known sets of rules. This is saved in the project initialization file as DRC_RULES=number.
DRCE_COMPILER_STATE

```
emun
{
    DRC_NO_COMPILER = 0
    DRC_BEFORE_LOGSYN,
    DRC_AFTER_LOGSYN,
    DRC_AFTER_SIMNET
} DRCE_COMPILER_STATE;
```

This type is used to indicate the current state of the compiler and is exported to the compiler control module.
DRCS_CLOCK_GROUP

```
typedef struct clock_group
{
    DBT_ID          equation_id;
    BOOL            ripple_group;
    int             use_count;
    DRCS_CLOCK_NODE *devices;
    struct clock_group *next;
} DRCS_CLOCK_GROUP;
```

This structure holds data about a group of synchronous devices that share a common clock, referred to as a "clocking group." For each clocking group in a design, this structure holds a pointer to the list of devices clocked by this pin or equation; the database ID of the clock pin or equation; whether or not this clocking group is part of a ripple clocking chain, the number of registers in a group, and a pointer to the next clocking group.
DRCS_CLOCK_NODE

```
typedef struct clock_node
{
    DBT_ID          device_clocked;
    DRCT_ID         clock_group;
    BOOL            negative;
    struct drcs_node *next;
} DRCS_CLOCK_NODE;
```

This structure defines a node in a clocking group, which is an occurrence of a synchronous device. The invention does not require a designation of the type of synchronous device represented in a clocking group, whether it be a latch, a DFF, a JKFF, or a state machine. This structure holds the database ID of the synchronous device, the clock group ID, and the sense of the clock when it reaches this node.
DRCS_ID_LIST

```
typedef struct id_list
{
    DBT_ID          id;
    int             use_count;
    struct id_list  *next;
} DRCS_ID_LIST;
```

This structure holds a single pin in a list of input pins in a design. The use count variable is the number of synchronous devices that are driven by this pin through any combinatorial logic. The structure also records the database id of the pin it represents, and a pointer to the next element in the list. This structure is use when determining the master reset pin for a design.

3.7 DRCE_OPERATOR

```
typedef enum
{
        DRC_NO_OP = 0,
        DRC_AND,
        DRC_OR,
        DRC_XOR,
        DRC_NAND,
        DRC_NOR,
        DRC_XNOR,
        DRC_NOT,
        DRC_DELAY,
        DRC_MAX_OP
} DRCE_OPERATOR;
```

This type defines the logical operators that can exist within the logic tree extracted from the compiler database by the invention. Unlike the Compiler, there is a single type for each operator, instead of a type with an embedded pin count. That information is stored in the tree node, as discussed below.

3.8 DRCS_TREE_NODE

```
typedef struct tree_node
{
        DRCE_OPERATOR   op;
        int             node_count;
        int             term_count;
        DBT_ID          *terms;
        struct tree_node **nodes;
} DRCS_TREE_NODE;
```

This structure defines a node in the logic tree used in static hazard detection. Conceptually, each node in this tree represents a gate in the design before the tree is converted to sum-of-products form. The structure lists the logical operation that it represents, the number of other nodes that are inputs to this node, and the number of fixed database records that are also inputs to this node. The fixed database records represent input pins and synchronous devices. The node then holds a pointer to an array of database record IDs and a pointer to an array of pointers to other nodes.

3.9 DRCS_WARNING

```
typedef struct id_list
{
        int      type;
        char     *name;
        char     **conditions;
        DBT_ID   *locations;
} DRCS_WARNING;
```

This structure holds a warning generated about a logic function. The type indicates whether this is a warning about a static 1 or a static 0 hazards. Name is the name of the primitive, which will be reported to the user, and conditions is a list of a names of sources in the design and the levels that they must be at for the hazard to exist. These sources are input nodes and synchronous devices. Finally, there is a list of database ids of the sources, which are used to generate location information when the error is reported.

3.10 DRCS_GRAPH_NODE

```
typedef struct
{
        DBT_ID   *inputs;
        DBT_ID   *outputs;
        int      input_count;
        int      output_count;
        int      untraced_inputs;
        int      untraced_outputs;
} DRCS_GRAPH_NODE;
```

This structure defines a node in the graph extracted from the database by the invention when checking for combinatorial latches, flipflops, and other feedback structures. Each record in the database holds a pointer to one of these structures. The structure then contains a list of inputs to this-database record, a list of all records which depend on this one for input, and the total number of elements in each list. It then records the number of inputs and outputs that have not yet been processed, as described above.

Compiler Interface

This function is the main entry point from the compiler control module and comprises the dispatch point for the functions which check the various design rules. As new design rules are created, they may be added to the appropriate stage of the compiler through this function.

```
BOOL drc_entry
(
    DRCE_COMPILER_STATE compiler_state
)
{
    BOOL result = TRUE;
    switch (compiler_state)
    {
    case DRC_BEFORE_LOGSYN:
        drc_init( );
        result = drc_check_clocks( );
        /* This function needs to know about clock groups */
        if (result) result = drc_check_asynch_signals( );
        drc_cleanup_clock_groups( );
        /* check_preset_clear will call check_master_reset */
        if (result)
        {
            if (drc_rules.check_preset_and_clear)
            {
                result = drc_check_preset_clear( );
            }
            else
            {
                if (drc_rules.check_master_reset)
                {
                    result = (drc_check_master_reset( );
                }
            }
            drc_cleanup_reset_groups( );
        }
        if (result && drc_rules.check_expanders)
        {
            result = drc_check_expanders( );
        }
        if (result && drc_rules.check_race)
        {
            result = drc_check_race( );
        }
        if (result && drc_rules.check_delay_chains)
        {
            result = drc_check_delay_chain( );
        }
```

```
            if (result && drc_rules.check_user_hazards &&
                !drc_rules.check_logsyn_hazards)
            {
                result = drc_check_hazards(TRUE, FALSE);
            }
            break
        case DRC_AFTER_LOGSYN:
            if(drc_rules.check_logsyn_hazards)
            {
                result = drc_check_hazards
                    (drc_rules.check_user_hazards,
                    TRUE);
            }
            break;
        case DRC_AFTER_SIMNET:
            break;
        default:
            drc_internal_error(IDRC_INVALID_STATE);
            break;
    }
    return (result);
}
```

As will now be apparent, the invention provides a simple and expedient technique for validating an original design, and a logic synthesized version of the original design, for conformance with or violation of predetermined design rules. In the preferred embodiment, the invention is implemented as an additional module of the above-noted MAX PLUS system and can be used in conjunction with that system for initial design checking. The MAX PLUS System is generally described in the MAX PLUS II Programmable Logic Development System and Software data sheet dated September, 1992, available from Altera Corporation. More information concerning the design rules implemented in the preferred embodiment is set forth in Appendix A to this specification. The user selectability of various levels of conformability testing (i.e., "EPLD Rules," "FLEX Rules") and the Custom Rule feature provide great flexibility in the use of the invention to check original user designs.

While the above provides a full and complete disclosure of the preferred embodiment of the invention, various modifications, alternate constructions and equivalents may be employed, as desired. For example, different design rule sets or additional rules provided to the design rule set described above, may be implemented in other embodiments of the invention. Therefore, the above description and illustrations should not be construed as limiting the scope of the invention, which is defined by the appended claims.

What is claimed is:

1. A method executing in a computer-aided logic design system for designing and testing logic circuitry prior to physical implementation, wherein the method verifies compliance of a logic design with a preselected set of design rules that specify logical relationships between electrical signals, wherein the logic design includes one or more electrical signals, wherein the logic design includes a group of two or more flipflops functioning as a state machine, the method comprising:

providing a design rule that is violated if the state machine has mutually exclusive groups of states;

providing a logic design file incorporating the initial logic design in computer-readable form;

comparing at least portions of the initial design to the design rule; and providing a user-discernable indication of any violation of the design rule by the initial logic design.

2. The method of claim 1 wherein the logic circuitry is for a programmable logic integrated circuit.

3. A method executing in a computer-aided logic design system for designing and testing logic circuitry prior to physical implementation, wherein the method verifies compliance of a logic design with a preselected set of design rules that specify logical relationships between electrical signals, wherein the logic design includes one or more electrical signals, wherein the logic design includes a group of two or more flipflops functioning as a state machine, the method comprising:

providing a design rule that is violated if the state machine has states that cannot return to a base state;

providing a logic design file incorporating the initial logic design in computer-readable form;

comparing at least portions of the initial design to the design rule; and providing a user-discernable indication of any violation of the design rule by the initial logic design.

4. The method of claim 3 wherein the logic circuitry is for a programmable logic integrated circuit.

5. A method executing in a computer-aided logic design system for designing and testing logic circuitry prior to physical implementation, wherein the method verifies compliance of a logic design with a preselected set of design rules that specify logical relationships between electrical signals, wherein the logic design includes one or more electrical signals, the method comprising:

providing a design rule that is violated if there is a static hazard in the logic design;

providing a logic design file incorporating the initial logic design in computer-readable form;

applying the design rule to at least portions of the initial logic design; and providing a user-discernable indication of any violation of the design rule by the initial logic design.

6. The method of claim 5 wherein a static hazard occurs when a logical output changes two times instead of remaining constant.

7. The method of claim 5 wherein the static hazard is a static-0 hazard.

8. The method of claim 5 where the static hazard is a static-1 hazard.

9. The method of claim 5 wherein the logic circuitry is for a programmable logic integrated circuit.

10. A method executing in a computer-aided logic design system for designing and testing logic circuitry prior to physical implementation, wherein the method verifies compliance of a logic design with a preselected set of design rules that specify logical relationships between electrical signals, wherein the logic design includes one or more electrical signals, the method comprising:

providing a design rule that is violated if there is a dynamic hazard in the logic design;

providing a logic design file incorporating the initial logic design in computer-readable form;

applying the design rule to at least portions of the initial logic design; and providing a user-discernable indication of any violation of the design rule by the initial logic design.

11. The method of claim 10 wherein a dynamic hazard occurs when a logical output changes three or more times instead of once.

12. The method of claim 10 wherein the logic circuitry is for a programmable logic integrated circuit.

13. A method executing in a computer-aided logic design system for designing and testing logic circuitry prior to physical implementation, wherein the method verifies compliance of a logic design with a preselected set of design rules that specify logical relationships between electrical signals, wherein the logic design includes one or more electrical signals, the method comprising:

provide a first design rule that is violated if there is a static hazard in the logic design;

providing a second design rule that is violated if there is a dynamic hazard in the logic design;

providing a logic design file incorporating the initial logic design in computer-readable form;

applying the first design rule and the second design rule to at least portions of the initial logic design; and providing a user-discernable indication of any violation of the design rules by the initial logic design.

14. The method of claim 13 wherein a static hazard occurs when a logical output changes two times instead of remaining constant.

15. The method of claim 13 wherein the static hazard is a static-0 hazard.

16. The method of claim 13 where the static hazard is a static-1 hazard.

17. The method of claim 13 wherein a dynamic hazard occurs when a logical output changes three or more times instead of once.

18. The method of claim 13 wherein the logic circuitry is for a programmable logic integrated circuit.

19. A method executing in a computer-aided logic design system for designing and testing logic circuitry for a programmable logic integrated circuit prior to physical implementation, wherein the method verifies compliance of a logic design with a preselected set of design rules that specify logical relationships between electrical signals, wherein the logic design includes one or more electrical signals, the method comprising:

providing a design rule that is violated if there are components in the logic design having an input coupled to an asynchronous signal and an output coupled to a synchronous device;

providing a logic design file incorporating the initial logic design in computer-readable form;

applying the design rule to at least portions of the initial logic design; and providing a user-discernable indication of any violation of the design rule by the initial logic design.

20. A method executing in a computer-aided logic design system for designing and testing logic circuitry for a programmable logic integrated circuit prior to physical implementation, wherein the method verifies compliance of a logic design with a preselected set of design rules that specify logical relationships between electrical signals, wherein the logic design includes one or more electrical signals, the method comprising:

providing a design rule that is violated if an input signal drives more than one register in a bank of registers clocked by a common clock signal;

providing a logic design file incorporating the initial logic design in computer-readable form;

applying the design rule to at least portions of the initial logic design; and providing a user-discernable indication of any violation of the design rule by the initial logic design.

21. A method executing in a computer-aided logic design system for designing and testing logic circuitry for a programmable logic integrated circuit prior to physical implementation, wherein the method verifies compliance of a logic design with a preselected set of design rules that specify logical relationships between electrical signals, wherein the logic design includes one or more electrical signals, the method comprising:

providing a design rule that is violated if the flipflop's control signal is derived from the flipflop's output;

providing a logic design file incorporating the initial logic design in computer-readable form;

applying the design rule to at least portions of the initial logic design; and providing a user-discernable indication of any violation of the design rule by the initial logic design.

22. A method executing in a computer-aided logic design system for designing and testing logic circuitry for a programmable logic integrated circuit prior to physical implementation, wherein the method verifies compliance of a logic design with a preselected set of design rules that specify logical relationships between electrical signals, wherein the logic design includes one or more electrical signals, the method comprising:

providing a design rule that is violated if a common reset signal is not detected in the logic design;

providing a logic design file incorporating the initial logic design in computer-readable form;

applying the design rule to at least portions of the initial logic design; and providing a user-discernable indication of any violation of the design rule by the initial logic design.

23. A method executing in a computer-aided logic design system for designing and testing logic circuitry for a programmable logic integrated circuit prior to physical implementation, wherein the method verifies compliance of a logic design with a preselected set of design rules that specify logical relationships between electrical signals, wherein the logic design includes one or more electrical signals and at least one clock signal source, the method comprising:

providing a logic design file incorporating the initial logic design in computer-readable form;

providing a first design rule that is violated if more than one clock signal source is used in the logic design;

providing a second design rule that is violated if more than two gates are present between a clock signal input of a component and the clock signal generation source;

providing a third design rule that is violated if a synchronous device that is synchronized to a first clock signal receives data that is synchronized to a second clock signal;

providing a fourth design rule that determines permitted and prohibited clear signal distribution schemes;

comparing at least portions of the initial design to the first, second, third and fourth design rules; and providing a user-discernable indication of any violation of the design rules by the initial logic design.

24. A method executing in a computer-aided logic design system for designing and testing logic circuitry prior to physical implementation, wherein the method verifies compliance of a logic design with a preselected set of design rules that specify logical relationships between electrical signals, wherein the logic design includes one or more electrical signals and at least one clock signal source, the method comprising:

providing a design rule that is violated if a synchronous device that is synchronized to a first clock signal receives data that is synchronized to a second clock signal;

providing a logic design file incorporating the initial logic design in computer-readable form;

comparing at least portions of the initial design to the design rule; and providing a user-discernable indication of any violation of the design rule by the initial logic design.

25. The method of claim 24 wherein the logic circuitry is for a programmable logic integrated circuit.

26. A method executing in a computer-aided logic design system for designing and testing logic circuitry prior to physical implementation, wherein the method verifies compliance of a logic design with a preselected set of design rules that specify logical relationships between electrical signals, wherein the logic design includes one or more electrical signals and at least one clock signal source, the method comprising:

providing a design rule that is violated if the output of one register feeds a clock input of another register;

providing a logic design file incorporating the initial logic design in computer-readable form;

comparing at least portions of the initial design to the design rule; and providing a user-discernable indication of any violation of the design rule by the initial logic design.

27. The method of claim 26 wherein the logic circuitry is for a programmable logic integrated circuit.

28. A method executing in a computer-aided logic design system for designing and testing logic circuitry prior to physical implementation, wherein the method verifies compliance of a logic design with a preselected set of design rules that specify logical relationships between electrical signals, wherein the logic design includes one or more electrical signals, the method comprising:

providing a design rule that is violated if one of a set of given primitives has a single fan out to another one of the set of primitives, with some added look-ahead;

providing a logic design file incorporating the initial logic design in computer-readable form;

comparing at least portions of the initial design to the design rule; and providing a user-discernable indication of any violation of the design rule by the initial logic design.

29. A method executing in a computer-aided logic design system for designing and testing logic circuitry prior to physical implementation, wherein the method verifies compliance of a logic design with a preselected set of design rules that specify logical relationships between electrical signals, wherein the logic design includes one or more electrical signals, the method comprising:

providing a design rule that is violated if there is a cross-coupled expander structure;

providing a logic design file incorporating the initial logic design in computer-readable form;

comparing at least portions of the initial design to the design rule; and providing a user-discernable indication of any violation of the design rule by the initial logic design.

30. A method executing in a computer-aided logic design system for designing and testing logic circuitry prior to physical implementation, wherein the method verifies compliance of a logic design with a preselected set of design rules that specify logical relationships between electrical signals, wherein the logic design includes one or more electrical signals and at least one clock signal source, the method comprising:

providing a design rule that is violated if a clock-to-output delay of each member of an output group is not the same;

providing a logic design file incorporating the initial logic design in computer-readable form;

comparing at least portions of the initial design to the design rule; and providing a user-discernable indication of any violation of the design rule by the initial logic design.

31. A method executing in a computer-aided logic design system for designing and testing logic circuitry prior to physical implementation, wherein the method verifies compliance of a logic design with a preselected set of design rules that specify logical relationships between electrical signals, wherein the logic design includes one or more electrical signals, the method comprising:

providing a design rule that determines permitted and prohibited preset signal distribution schemes;

providing a logic design file incorporating the initial logic design in computer-readable form;

applying the design rule to at least a portion of the initial logic design; and providing a user-discernable indication of any violation of the design rule by the initial logic design.

32. A method executing in a computer-aided logic design system for designing and testing logic circuitry prior to physical implementation, wherein the method verifies compliance of a logic design with a preselected set of design rules that specify logical relationships between electrical signals, wherein the logic design includes one or more electrical signals, the method comprising:

providing a design rule that is violated if there is a cross-coupled NAND structure;

providing a logic design file incorporating the initial logic design in computer-readable form;

comparing at least portions of the initial design to the design rule; and providing a user-discernable indication of any violation of the design rule by the initial logic design.

33. A method executing in a computer-aided logic design system for designing and testing logic circuitry for a programmable logic integrated circuit prior to physical implementation, wherein the method verifies compliance of a logic design with a preselected set of design rules that specify logical relationships between electrical signals, wherein the logic design includes one or more electrical signals, the method comprising:

providing a design rule that is violated if an input signal drives more than one register in a bank of registers cleared using a common clear signal;

providing a logic design file incorporating the initial logic design in computer-readable form;

applying the design rule to at least portions of the initial logic design; and providing a user-discernable indication of any violation of the design rule by the initial logic design.

34. A method executing in a computer-aided logic design system for designing and testing logic circuitry for a programmable logic integrated circuit prior to physical implementation, wherein the method verifies compliance of a logic design with a preselected set of design rules that specify logical relationships between electrical signals, wherein the logic design includes one or more electrical signals, the method comprising:

provide a design rule that is violated if an input signal drives more than one register in a bank of registers preset using a common preset signal;

providing a logic design file incorporating the initial logic design in computer-readable form;

applying the design rule to at least portions of the initial logic design; and providing a user-discernable indication of any violation of the design rule by the initial logic design.

35. A method executing in a computer-aided logic design system for designing and testing logic circuitry for a programmable logic integrated circuit prior to physical implementation, wherein the method verifies compliance of a logic design with a preselected set of design rules that specify logical relationships between electrical signals, wherein the logic design includes one or more electrical signals, the method comprising:

providing a logic design file incorporating the initial logic design in computer-readable form;

providing a design rule that is violated if more than one clear signal source is used in the logic design;

comparing at least portions of the initial design to the design rule; and providing a user-discernable indication of any violation of the design rule by the initial logic design.

36. A method executing in a computer-aided logic design system for designing and testing logic circuitry for a programmable logic integrated circuit prior to physical implementation, wherein the method verifies compliance of a logic design with a preselected set of design rules that specify logical relationships between electrical signals, wherein the logic design includes one or more electrical signals, the method comprising:

providing a logic design file incorporating the initial logic design in computer-readable form;

providing a design rule that is violated if more than two gates are present between a clear signal input of a component and a clear signal generation source;

comparing at least portions of the initial design to the design rule; and providing a user-discernable indication of any violation of the design rule by the initial logic design.

37. A method executing in a computer-aided logic design system for designing and testing logic circuitry for a programmable logic integrated circuit prior to physical implementation, wherein the method verifies compliance of a logic design with a preselected set of design rules that specify logical relationships between electrical signals, wherein the logic design includes one or more electrical signals, the method comprising:

providing a logic design file incorporating the initial logic design in computer-readable form;

providing a design rule that is violated if a synchronous device that is synchronized to a first clear signal receives data that is synchronized to a second clear signal;

comparing at least portions of the initial design to the design rule; and providing a user-discernable indication of any violation of the design rule by the initial logic design.

38. A method executing in a computer-aided logic design system for designing and testing logic circuitry for a programmable logic integrated circuit prior to physical implementation, wherein the method verifies compliance of a logic design with a preselected set of design rules that specify logical relationships between electrical signals, wherein the logic design includes one or more electrical signals, the method comprising:

providing a logic design file incorporating the initial logic design in computer-readable form;

providing a design rule that is violated if more than one preset signal source is used in the logic design;

comparing at least portions of the initial design to the design rule; and providing a user-discernable indication of any violation of the design rule by the initial logic design.

39. A method executing in a computer-aided logic design system for designing and testing logic circuitry for a programmable logic integrated circuit prior to physical implementation, wherein the method verifies compliance of a logic design with a preselected set of design rules that specify logical relationships between electrical signals, wherein the logic design includes one or more electrical signals, the method comprising:

providing a logic design file incorporating the initial logic design in computer-readable form;

providing a design rule that is violated if more than two gates are present between a preset signal input of a component and a preset signal generation source;

comparing at least portions of the initial design to the design rule; and providing a user-discernable indication of any violation of the design rule by the initial logic design.

40. A method executing in a computer-aided logic design system for designing and testing logic circuitry for a programmable logic integrated circuit prior to physical implementation, wherein the method verifies compliance of a logic design with a preselected set of design rules that specify logical relationships between electrical signals, wherein the logic design includes one or more electrical signals, the method comprising:

providing a logic design file incorporating the initial logic design in computer-readable form;

providing a design rule that is violated if a synchronous device that is synchronized to a first preset signal receives data that is synchronized to a second preset signal;

comparing at least portions of the initial design to the design rule; and providing a user-discernable indication of any violation of the design rule by the initial logic design.

41. A method executing in a computer-aided logic design system for designing and testing logic circuitry for a programmable logic integrated circuit prior to physical implementation, wherein the method verifies compliance of a logic design with a preselected set of design rules that specify logical relationships between electrical signals, wherein the logic design includes one or more electrical signals, the method comprising:

providing a logic design file incorporating the initial logic design in computer-readable form;

providing a design rule that determines permitted and prohibited preset functions;

comparing at least portions of the initial design to the design rule; and providing a user-discernable indication of any violation of the design rule by the initial logic design.

42. A method executing in a computer-aided logic design system for designing and testing logic circuitry for a programmable logic integrated circuit prior to physical implementation, wherein the method verifies compliance of a logic design with a preselected set of design rules that specify logical relationships between electrical signals, wherein the logic design includes one or more electrical signals, the method comprising:

providing a logic design file incorporating the initial logic design in computer-readable form;

providing a design rule that determines permitted and prohibited clear functions;

comparing at least portions of the initial design to the design rule; and providing a user-discernable indication of any violation of the design rule by the initial logic design.

43. A method executing in a computer-aided logic design system for designing and testing logic circuitry prior to physical implementation, wherein the method verifies compliance of a logic design with a preselected set of design rules that specify logical relationships between electrical signals, wherein the logic design includes one or more electrical signals, the method comprising:

providing a design rule that is violated if a synchronous device that is cleared using a first clear signal receives data that is cleared using a second clock signal;

providing a logic design file incorporating the initial logic design in computer-readable form;

comparing at least portions of the initial design to the design rule; and providing a user-discernable indication of any violation of the design rule by the initial logic design.

44. A method executing in a computer-aided logic design system for designing and testing logic circuitry prior to physical implementation, wherein the method verifies compliance of a logic design with a preselected set of design rules that specify logical relationships between electrical signals, wherein the logic design includes one or more electrical signals, the method comprising:

providing a design rule that is violated if a synchronous device that is cleared using a first preset signal receives data that is preset using a second preset signal;

providing a logic design file incorporating the initial logic design in computer-readable form;

comparing at least portions of the initial design to the design rule; and providing a user-discernable indication of any violation of the design rule by the initial logic design.

45. A method executing in a computer-aided logic design system for designing and testing logic circuitry prior to physical implementation, wherein the method verifies compliance of a logic design with a preselected set of design rules that specify logical relationships between electrical signals, wherein the logic design includes one or more electrical signals, the method comprising:

providing a design rule that is violated if the output of one register feeds a clear input of another register;

providing a logic design file incorporating the initial logic design in computer-readable form;

comparing at least portions of the initial design to the design rule; and providing a user-discernable indication of any violation of the design rule by the initial logic design.

46. A method executing in a computer-aided logic design system for designing and testing logic circuitry prior to physical implementation, wherein the method verifies compliance of a logic design with a preselected set of design rules that specify logical relationships between electrical signals, wherein the logic design includes one or more electrical signals, the method comprising:

providing a design rule that is violated if the output of one register feeds a preset input of another register;

providing a logic design file incorporating the initial logic design in computer-readable form;

comparing at least portions of the initial design to the design rule; and providing a user-discernable indication of any violation of the design rule by the initial logic design.

47. A method executing in a computer-aided logic design system for designing and testing logic circuitry prior to physical implementation, wherein the method verifies compliance of a logic design with a preselected set of design rules that specify logical relationships between electrical signals, wherein the logic design includes one or more electrical signals, the method comprising:

providing a design rule that is violated if a clear-to-output delay of each member of an output group is not the same;

providing a logic design file incorporating the initial logic design in computer-readable form;

comparing at least portions of the initial design to the design rule; and providing a user-discernable indication of any violation of the design rule by the initial logic design.

48. A method executing in a computer-aided logic design system for designing and testing logic circuitry prior to physical implementation, wherein the method verifies compliance of a logic design with a preselected set of design rules that specify logical relationships between electrical signals, wherein the logic design includes one or more electrical signals, the method comprising:

providing a design rule that is violated if a preset-to-output delay of each member of an output group is not the same;

providing a logic design file incorporating the initial logic design in computer-readable form;

comparing at least portions of the initial design to the design rule; and providing a user-discernable indication of any violation of the design rule by the initial logic design.

* * * * *